United States Patent [19]

Biswas et al.

[11] Patent Number: 5,213,748
[45] Date of Patent: May 25, 1993

[54] METHOD OF MOLDING A THERMOPLASTIC RING ONTO A LEADFRAME

[75] Inventors: Ranjit Biswas, Westford; Michael A. Zimmerman, North Andover, both of Mass.

[73] Assignee: AT&T Bell Laboratories, Murray Hill, N.J.

[21] Appl. No.: 722,069

[22] Filed: Jun. 27, 1991

[51] Int. Cl.⁵ ............................................. B29C 45/12
[52] U.S. Cl. ............................ 264/251; 264/272.13; 264/272.15; 264/277; 264/328.12
[58] Field of Search ...................... 264/272.11, 272.13, 264/272.17, 274, 275, 276, 251, 255, 272.15, 277, 328.12; 425/121; 249/91

[56] References Cited

U.S. PATENT DOCUMENTS

| | | | |
|---|---|---|---|
| 3,341,647 | 9/1967 | Aberle | 264/276 |
| 4,632,798 | 12/1986 | Eickman et al. | 264/272.13 |
| 4,778,635 | 10/1988 | Hechtman et al. | 264/272.13 |
| 4,837,184 | 6/1989 | Lin et al. | 264/272.11 |
| 4,859,632 | 8/1989 | Lumbard | 264/272.11 |
| 4,873,615 | 10/1989 | Grabbe | 361/386 |

Primary Examiner—Jan H. Silbaugh
Assistant Examiner—Angela Artiz
Attorney, Agent, or Firm—E. Weiss

[57] ABSTRACT

In a pre-molded package assembly, a thermoplastic ring molded onto a leadframe must maintain lead coplanarity. In this invention a plastic member of liquid crystal polmar is molded onto the leads of a metal leadframe. The plastic member is a thermoplastic anisotropic material which, when formed, has a flow direction which is in the long dimension of the plastic member and a transverse direction which is in the short dimension of the plastic member. Dam members on the leadframe help contain the plastic molding compound within the mold cavity during the molding process. A puddle gate prevents the formation of a weld line in the plastic member. Upon completion of the molding process, the dam members are excised from the leadframe to provide discrete leads.

3 Claims, 4 Drawing Sheets

METHOD OF MOLDING A THERMOPLASTIC RING ONTO A LEADFRAME

TECHNICAL FIELD

This invention relates generally to leadframes for silicon devices and more particularly to a metal leadframe for physically supporting and electrically connecting a silicon device to the larger lead spacings of the next higher level of interconnection such as a printed circuit board.

BACKGROUND OF THE INVENTION

Silicon integrated devices, because of their small size and fragile nature are frequently embedded in a plastic molding compound and electrically connected to an array of electrical conductors which project beyond the edge of the assemblage. The ends of the electrical conductors embedded within the plastic molding compound and located close to the silicon device are known as the inner leads and are connected to bonding pads on the silicon device through fine gold wire bonds. The outer ends of the leads which project outward from the edge of the assemblage are shaped to form "J" type leads or "Gull Wing" leads for mounting onto a circuit board.

The plurality of leads which connect the silicon device to the circuit board is stamped or punched from sheet material and is called a leadframe. In those instances where the density of the leads is high, the leads may be formed by etching because the spacing between the inner leads may be too small to be formed with a punch tool.

After the leadframe is formed, the inner end of each lead is connected to a bond pad on a silica device by means of a gold or aluminium wire. In some instances, the silicon devices are supported by a ceramic member which, in turn, is physically supported by the inner leads. Thus, the ends of the inner leads are electrically connected to the silicon device and also provides support for the silicon device.

One method of forming the final package is by a "post-molding" process. In the process the leadframe is entirely encapsulated by a thermoset plastic molding compound.

Encapsulation normally occurs in a production-size molding tool over a three minute cycle. Of the three minute cycle time, the plastic molding compound flows into the mold in 15 seconds, two minutes is needed to polymerize or cure the plastic; and the remaining time is used to prepare the mold for the next molding cycle. The plastic molding compound generates flow-induced stresses on the fragile silicon device, the connecting wires and the leads as it fills the cavity which causes damage and yield loss.

Another method of packaging electronic devices is that of a pre-molded package. In this method a plastic ring or shell is molded around a leadframe, the silicon devices are attached to the leadframe in some fashion, and a lid or cover is attached to seal the package. With this method the molding compound does not flow over the silicon devices and wirebonds.

In both packaging schemes, it is critical to maintain coplanarity of the leads after the package is fabricated. In the case of the post-molded package, the thermoset material provides enough mass and the thermal shrinkage is uniform enough so as to assure coplanarity of the leads in the final configuration. In the case of pre-molded packages, a frame member is molded around the leads initially, the silicon devices or substrate is then attached followed by attachment of a cover. The frame is a thin member which must be strong enough to withstand subsequent trim and form operations. In this case the plastic is generally a thermoplastic material and due to this type of molding, it can often contain large stresses which can lead to excessive warping. This warpage can often cause unacceptable warpage of the leadframe thus causing difficulty in attaching the leadframe to a printed circuit board.

This invention is directed towards providing a substantially flat pre-molded leadframe which minimizes the stresses applied to solder joints and resists cracking and/or breaking during assemblage.

SUMMARY OF THE INVENTION

In a pre-molded package assembly, a thermoplastic ring molded onto a leadframe must maintain lead coplanarity. In this invention a plastic member of liquid crystal polmar is molded onto the leads of a metal leadframe. The plastic member is a thermoplastic anisotropic material which, when formed, has a flow direction which is in the long dimension of the plastic member and a transverse direction which is in the short dimension of the plastic member. Dam members on the leadframe help contain the plastic molding compound within the mold cavity during the molding process. A puddle gate prevents the formation of a weld line in the plastic member. Upon completion of the molding process, the dam members are excised from the leadframe to provide discrete leads.

DETAILED DESCRIPTION

Most silicon devices packaged in plastic consists of electrical leads which connect small bond pad spaces of the silicon device to larger lead spacings of the next higher level of interconnection such as a printed circuit board. One such package is a pre-molded plastic package which contains a silicon device supported by a ceramic member and electrically connected via wire bonds to a leadframe.

Most plastic packages are post-molded, which means that the package body is molded over the assemblage after the silicon device has been attached to the leadframe, a fan-out pattern of leads.

Following molding, the plastic package usually requires some secondary operations such as a large batch post cure or post polymerization to complete the polymerication reaction. The leads of the leadframe are then formed to their final configuration in a trim and form operation. Other secondary operations can include writing information on the package; testing; and a burn in test where the device is operated at elevated temperatures and bias to eliminate premature failures.

Figure 1:
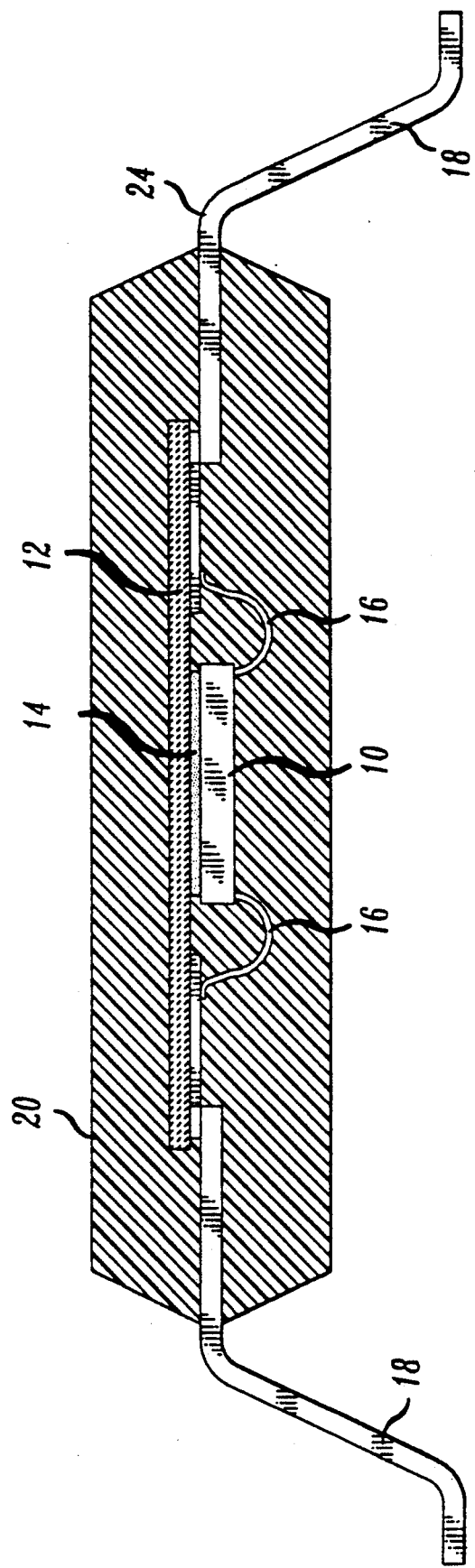
FIG. 1 is a sectional view of a prior art plastic molded chip assemblage.
Figure 2:
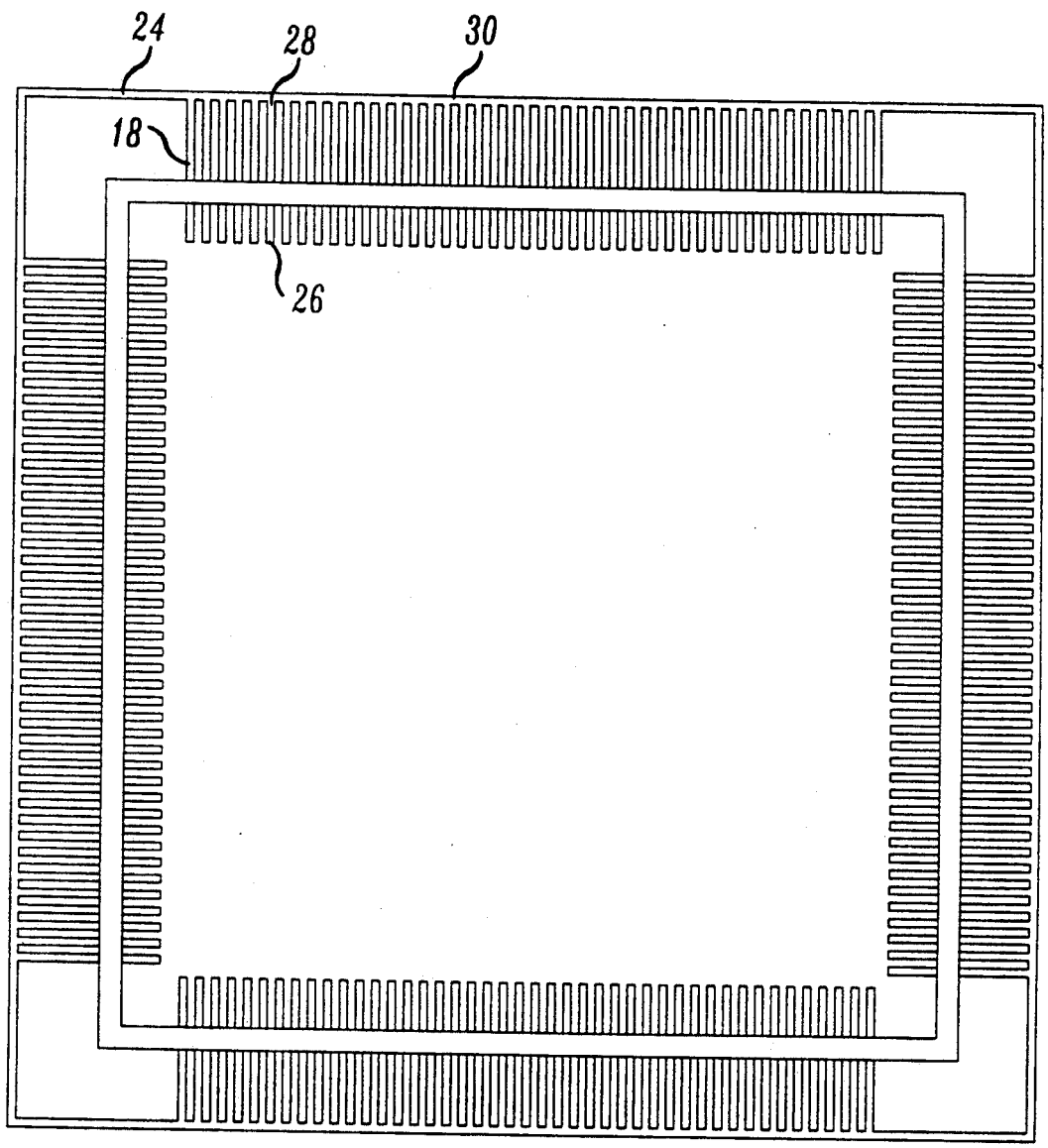
FIG. 2 is a view of a prior art leadframe supporting a plastic ring.

Referring to FIG. 1, there is illustrated a cutaway view of a semiconductor device supported by a ceramic member and electrically coupled to the leads of a leadframe and encapsulated in plastic. In the illustrated embodiment, a silicon device 10 is secured to a ceramic member 12 by thermally conductive epoxy adhesive 14. The ceramic member 12 supports conductive paths for making electrical connections from the silicon device to the leads of a lead frame 24. FIG. 2 illustrates a typical prior art leadframe 24. Returning to FIG. 1, fine wire bonds 16 electrically connect the various bond pads on the silicon device 10 to appropriate conductive paths on the ceramic member 12. The conductive paths on the ceramic member 12 are also connected electrically to the inner ends of the various leads 18 of the leadframe 24. In the completed assemblage, the ceramic member 12, silicon device 10, wire bands 16 and inner ends of the leads 18 are embedded within a plastic molding compound 20 which provides support and electrical isolation.

The leads 18 for surface mount packages are normally formed into "J" leads or "gull wing" leads. J leads extend under the molded body and conserve area on the circuit board. However, they are difficult to inspect. Gull wing leads, such as leads 18 are formed to extend away from the molded body and allow for visual inspection of solder attachments to the printed circuit board. Fine pitch plastic packages typically use gull wing leads when attachment yield is an issue.

Referring now to FIG. 2, there is illustrated a typical lead frame prior to having been attached to the ceramic member 12 and the wire bonds 16. The leadframe 24 can be of a flat sheet of metal such as copper, copper alloy or the like stamped or etched to form a square of a plurality of conductive leads 18 having inner ends 26 and outer ends 28. The outer ends 28 are attached to an outer frame support member 30 which holds the various leads 18 in position relative to each other until after the ends 26 of the leads 18 have been connected to the ceramic member 12 and the wire bands 16, and the assemblage has been encapsulated in the plastic molding compound. Following the molding process the outer frame support member 30 is removed from the leads 18; and, the ends 28 of the leads 18 are formed to their final configuration in a trim and form operation.

Briefly, there are several different organic and inorganic materials used to package silicon devices commonly referred to an microelectronic devices. They include copper-rich alloys and an iron-nickel alloy. Iron-nickel has a coefficient of thermal expansion which is closer to silicon and has better mechanical properties than the copper-based alloys. The disadvantage of iron-nickel is that it has a low thermal conductivity. The ever increasing need to dissipate heat as the devices become larger require using copper alloys, it being remembered, however, that these materials have limitations on thermal expansion and mechanical properties.

The metal leads 18 have a direct effect on the performance characteristics of the device as they provide a path for removing heat from the silicon device. The leads are formed from punched or stamped sheet stock. Those which require high interconnection density, such as 164-lead packages and above, are normally formed by etching because the inner lead spacing is too small to be formed with a punching tool. Gold or aluminum wires 12 are used to connect the ends 26 of the leads to the band pads on the silicon device.

The encapsulating material, which is a thermoset polymer molding compound, is one of the most important materials in molded plastic packaging. The molding polymer is converted from a low-viscosity fluid to a hard plastic during the process. Although it has a softening point, or glass transition temperature, it does not flow after polymerization, even at soldering temperatures, because it has a cross-linked molecular architecture.

Epoxy is the cross-linkable resin for nearly all commercial molding compounds. The formulation consists of a mixture of epoxy resin, hardener, catalyst, fillers, flame retardants, flexiblizer, coupling agents, mold release agents and colorants. Important molding compound properties include low viscosity to reduce damage to the fragile assemblies during molding, rapid cure to provide high productivity and low thermal shrinkage forces caused by differences in coefficient of thermal expansion among molding compound, leadframe and the silicon device.

Present day low-stress molding compounds have low coefficient of thermal expansion and low modulus to minimize the stresses generated, excellent strength to resist the cracking these stresses promote, and good adhesion to the silicon device and leadframe to disseminate the stresses over the entire package volume. Normally, the molding compound contains about 75 percent by weight of inorganic filler, e.g., ground silicon to lower the coefficient of thermal expansion and increase thermal conductivity. Higher filler loadings achieved through improvements in filler size and size distribution have lowered the coefficient of thermal expansion while reducing the material viscosity.

Almost all post-molded plastic packages are made by a transfer molding process using thermoset molding compounds. The assembled leadframe is loaded on the molding tool either manually or with an automated leadframe loader. The molding compound is pre-softened by heating it in a dielectric preheater above its glass transition temperature. It is then placed in a cylindrical cavity in the molding tool. The operator starts the transfer by beginning the plunger movement that pushes the molding compound out of the transfer pot and into the mold. After the mold is filled, the pressure is increased and the molding compound is packed and further polymerized under a higher applied pressure. Packing is important because the material is porous after filling. Packing compresses both macroscopic and microscopic voids in the molded body, lowers package permeability and eliminates voids where liquid water can collect and promote corrosion. After the molding process, the leads are formed.

The alternative packaging method used for ICs is that of a thermoplastic pre-molded package. Though by utilizing these types of package the wiresweep issue is no longer significant. There are significant issues related to coplanarity which must be maintained within ±0.002 inches; that the leadframe should be robust enough to withstand the stresses imposed on it during the assemblage and encapsulation process; and, the leadframe should be capable of withstanding the high temperatures that it experiences during subsequent soldering to the printed circuit board. These temperatures are up to 540° F. for exposure of up to ten minutes. Also, during this exposure, the plastic cannot experience any significant warping or change its properties.

Figure 3:
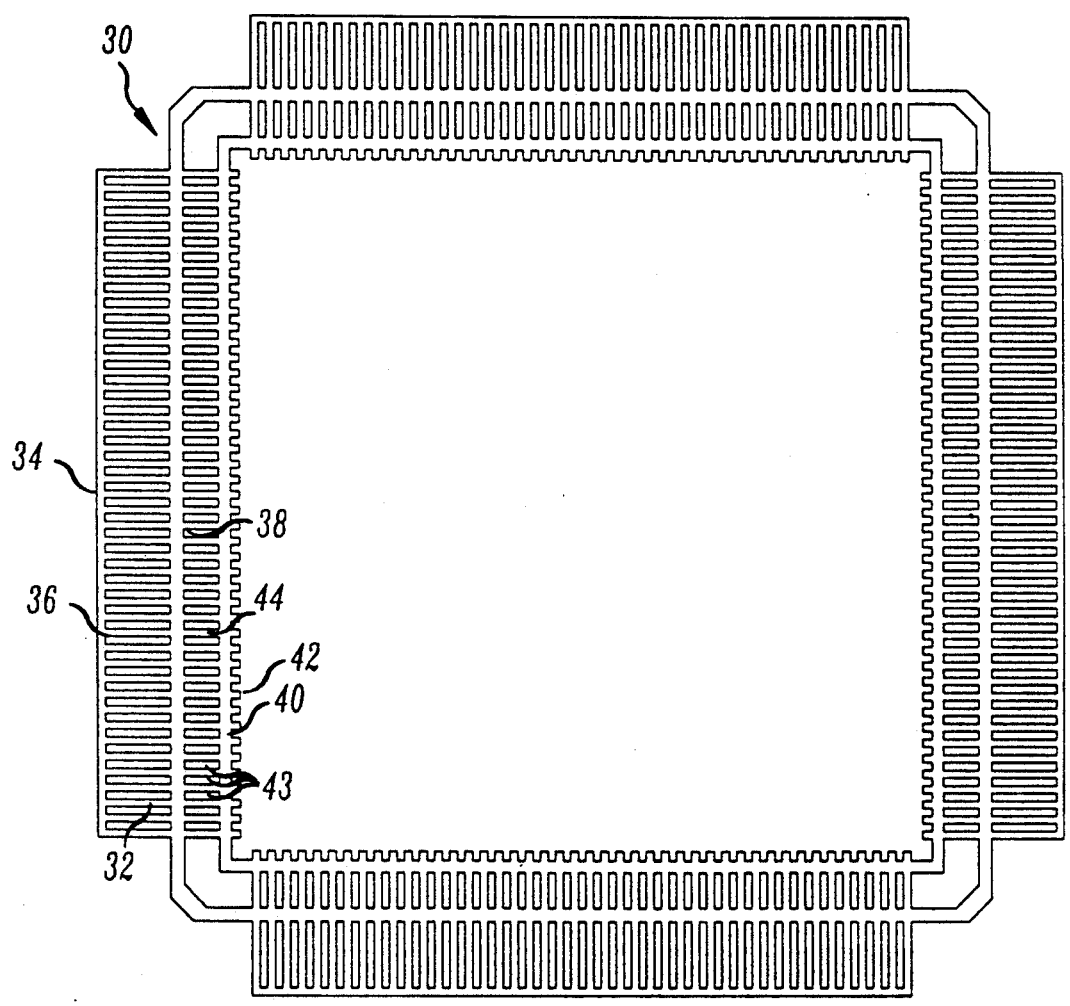
FIG. 3 is a view of a flat leadframe absent the plastic encapsulating material to more clearly illustrate first and second dam members in accordance with the principles of the invention.

Referring to FIG. 3, there is illustrated a lead frame in accordance with the principles of the invention which avoids the defects associated with present day leadframes. The leadframe 30 is composed of conductive material such as sheet copper or copper alloy or the like punched, stamped or etched to form leads 32 having an outer support frame member 34, an outer end 36, a first intermediate dam member 38, a second intermediate dam member 40, an intermediate section 44 located between the first and second intermediate dams 38, 40, and an inner end 42.

Onto the leadframe 30 a plastic member is formed to encapsulate the center portion 44 of each lead from the first intermediate dam frame member 38 to the second intermediate dam frame member 48 and to completely encircle the inner ends 42 of the leads.

The frame is of a thermoplastic material rather than a thermoset material which is not very tough and could fracture during the trim and forming operations. Thermoplastics differed from thermosets in that they are melted and then forced into a cold mold where they solidify, whereas thermosets are chemically cross-linked in a hot mold. Thermoplastics can be recycled as they can be reheated and remolded whereas thermosets cannot be returned to a liquid state. Thermosets typically have much higher in-use temperatures but several new thermoplastics are now available for applications involving temperatures higher than 500° F. In addition, thermoplastics and other unfilled polymers typically have coefficient of thermal expansions (CTE) of over 100 ppm/°C. The metal leadframe, if of a copper alloy material, has a CTE of about 17 ppm/°C.

The plastic member which encircles the inner ends of the leads is the structure which provides rigidity and coplanarity to the leads. Warping of the leads, either initially or during assembly of the package, or during attachment to the printed circuit board will prevent the package from being soldered correctly to the printed circuit board.

Stress and warping of the encircling plastic member can result from built in stresses which occur during the molding operation. In thermoplastic molding, the melted plastic is shot into a mold which is at a temperature below the freezing point of the plastic. Therefore, after the mold is completely filled, the material rapidly solidifies. However, during the filling of the mold, the material adjacent to the mold walls solidifies and skin layers form. These skin layers, if they are too thick or are asymmetrically located, can cause the formed plastic member and, therefore, the leads to twist or warp. Thus, the molding process and the design of the molding tool must be appropriately optimized to prevent severe skin layer build-up during the molding process. This suggests injecting the molding compound into the mold at high velocities.

However, high velocities can cause excessive shearing of the plastic as it flows through the small gate or gates of the mold into the mold cavity. Excessive shearing of the plastic material is to be avoided as it causes material degradation.

To encapsulate the center portions 44 of the leads, the leadframe is located within a mold tool which, depending upon the material that is being molded, is typically at a temperature of between 100° C. through 350° C. Thus, the leadframe which is put into the mold tool will be heated and expand. The plastic is then injected into the mold and encapsulates the center portions 44 of the leadframe. The plastic, upon solidification, shrinks and if the shrinkage is not equal to the expansion and subsequent contraction of the leadframe, warpage due to stress may be introduced into the leadframe. Thus, the design of the plastic member must be such that it does not warp or distort under the influence of residual internal stresses.

A plastic which gives good results is an anisotropic plastic material such as liquid crystal polymer resin XYDAR® G-330 liquid crystal polymer resin by Amoco Performance Products, Inc. located in Ridgefield, CT 06877, U.S.A.

The polymer used is a liquid crystal polymer. It is an anisotropic material which means that its properties are different in different directions. With this material, the gate location in the mold tool determines the flow direction and the transverse direction of the material as it flows across the leadframe in the mold. A high temperature material can result by adding glass and/or minerals to the polymer, which will also lower its Coefficient of Thermal Expansion (CTE). The material identified above, XYDAR® G-330, is a 30% glass-filled material with a CTE in the flow direction of 7 ppm/°C. and a CTE in the transverse direction which is near 100 ppm/°C. It is to be noted that the CTE of a copper leadframe is about 19 ppm. This difference of CTE contributes to the formation of residual stresses in the plastic member and the copper leadframe. The residual stress can be significant when it is realized that the plastic is molded at elevated temperatures and then allowed to cool to room temperature.

In the embodiment, the location of the gate is at a corner of the leadframe and, therefore, it is at a corner of the plastic frame member being formed. The die tool is clamped down on and covers the first and second intermediate dam frame members 38, 40. The center portions 44 of the leads are located within the mold cavity of the die tool. The gate of the die tool through which the plastic enters the die cavity is located at a corner of the die tool and, therefore, at one corner of the leadframe. This causes the plastic to split into two streams as it enters the die cavity. Each stream flows across the center portions of the leads of the near array of leads; make a sharp turn, and flows across the center portions of the leads of the remote array of leads. The two streams meet at the corner of the leadframe which is opposite the corner located at the entrance gate. The entrance gate can be positioned to allow plastic to enter on one side or on both sides of the leadframe. In either instance, the flow is balanced and proceeds uniformly along each side of the leadframe because of the presence of the openings 43 between adjacent leads. The plastic member formed has a coefficient of expansion along its major dimension, the direction of flow, which is substantially similar to that of the ceramic member 12 which is bonded to the ends of the inner leads. Thus, the stress where the ceramic member is joined to the ends of the leads is reduced. The direction across the direction of flow is the transverse direction. This dimension is small and has been found to cause substantially no stress to the solder joints.

During molding of the plastic encircling member onto the center portions 44 of the lead frame, the material flows in from one corner, breaks into two flow fronts, and then meets at the opposite corner. The meeting of the two flow fronts at the far corner results in what is referred to as a weld line. A weld line is weaker than the base material adjacent to the weld line and, therefore, is objectionable as the molded plastic part may fracture at the weld line during the trim and form operation. To avoid the formation of a weld line, a puddle gate is provided at the last to fill part of the mold cavity. In the embodiment disclosed, a puddle gate is provided at the corner of the leadframe which is opposite the input gate. The puddle gate permits a small amount of plastic to flow into a small reservoir which is not a part of the plastic member being formed. Thus, the weakest point, the weld line, is pushed out of the mold cavity and into the puddle gate reservoir which is designed to be broken away from the formed plastic member after molding.

To obtain the filling pressures which are required to fill the mold cavity with sufficient velocity, the cavity area must be sealed to prevent the plastic molding compound from leaking out onto the leads of the leadframe during the molding process. This seal is obtained with the first and second dam frame members 38, 40. The first and second dam frame members tie the various leads of the leadframe together to provide a flat sealing surface for the mold tool to close against. During the molding process, the plastic material encapsulates the center portions 44 of each lead and completely fills the spaces 43 between the center portions 44 of the leads. After molding, the first and second dam frame members 38, 40 are fully excised between each lead with a shearing tool to provide a leadframe which has discrete leads. At this time the outer support frame member 34 is removed from the outer ends 36 of the leads, and the leads are formed to the desired J or gull wing configuration. It is during this operation that the plastic frame which encircles the inner ends of the leads is subjected to large stresses which can cause cracking.

Figure 4:
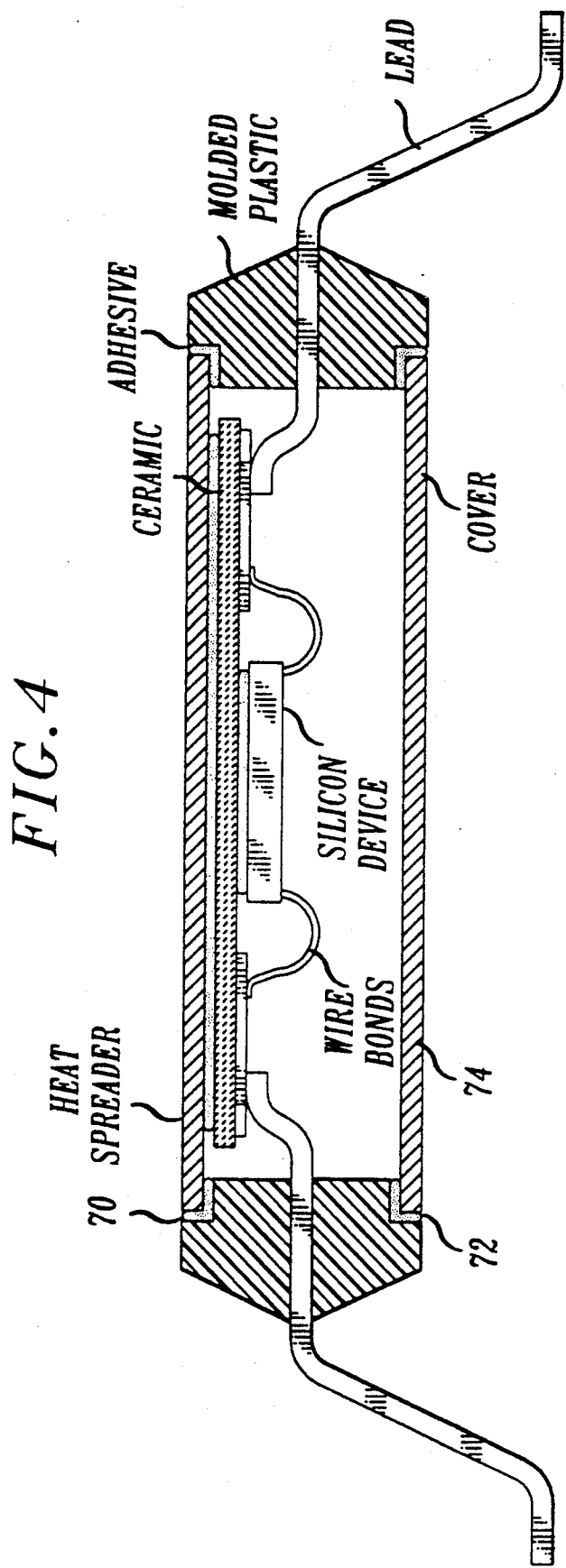
FIG. 4 is a semiconductor device package using the inventive leadframe.

Referring to FIG. 4, there is illustrated a cross sectional view of an assemblage using a lead frame member having a molded frame which encircles the inner ends of the leads in accordance with the principles of the invention. It is to be noted that the molded plastic frame which encapsulates portions of the leads can contain an upper step 70 which can accommodate a member for distributing heat; and a lower step 72 which can accommodate a member 74 for protecting the silica device and associated wire bonds. If desired, the assemblage can be encapsulated, either with or without the member 74 in place to provide an assemblage which is similar to that of FIG. 1.

We claim:

1. A method of forming a plastic member on a flat lead frame having a plurality of radially extending leads arranged side by side to form a ring where each lead has an outer end and an inner end, comprising the steps of
    joining said leads together with a first dam member to provide a first flat continuous ring located between the outer ends and the inner ends of said radially extending leads,
    joining said ring of leads together with a second dam member to provide a second flat continuous ring located between said first dam member and the inner ends of said radially extending leads, said first and second dam members dividing said leads into an outer section, an inner section and an intermediate section, and
    forming a ring of liquid crystal anisotropic thermoplastic material by directing flow of said material on the intermediate section of the ring of radially extending leads intermediate said first dam member and said second dam member wherein said liquid crystal anisotropic thermoplastic material has a coefficient of thermal expansion in the direction of flow which is substantially similar to the coefficient of thermal expansion of a ceramic member adapted to be coupled to the inner ends of said leads, and said material has a coefficient of thermal expansion in the transverse direction which is not substantially similar to the coefficient of thermal expansion of the ceramic member adapted to be coupled to said leads, thereby preventing warping of the lead frame upon solidification of said thermoplastic material.

2. The method of forming a plastic member on a lead frame as defined in claim 1 further comprising the step of causing the leading end of the liquid crystal anisotropic thermoplastic material to flow past the last lead of the side by side located leads being encapsulated then through to a puddle gate to a reservoir.

3. The method of forming a plastic ring member on a flat lead frame having four groups of leads wherein the leads of each group are arranged side by side and the four groups are arranged to form a square having four corners where each lead of each group has an outer end and an inner end comprising the steps of
    joining said leads of said groups together with a first ring shaped dam member located between the outer ends and the inner ends of said leads to provide a first flat continuous ring,
    joining said leads of said groups together with a second ring shaped dam member located between said first dam member and the inner ends of said leads to provide a second flat continuous ring, said first and second dam members dividing the leads of said groups of leads into an outer section, an inner section and an intermediate section,
    causing liquid crystal anisotropic thermoplastic material to flow along two paths simultaneously from a corner of said square to an opposite corner of said square to encapsulate the intermediate section of said leads of said groups of leads, and
    causing the leading ends of the molding compound of the two paths which merge at the opposite corner to flow through a puddle gate at the opposite corner wherein said liquid crystal anisotropic thermoplastic material has a coefficient of thermal expansion in the direction of flow which is substantially similar to the coefficient of thermal expansion of a ceramic member adapted to be coupled to the inner ends of said leads, and said material has a coefficient of thermal expansion in the transverse direction which is not substantially similar to the coefficient of thermal expansion of the ceramic member adapted to be coupled to said leads, thereby preventing warping of the lead frame upon solidification of said thermoplastic material.

* * * * *